United States Patent [19]

Jewell et al.

[11] Patent Number: 4,861,976

[45] Date of Patent: Aug. 29, 1989

[54] OPTICAL OR OPTO-ELECTRONIC DEVICE HAVING A TRAPPING LAYER IN CONTACT WITH A SEMICONDUCTIVE LAYER

[75] Inventors: Jack L. Jewell, Bridgewater; Samuel L. McCall, Jr., Gillette, both of N.J.

[73] Assignee: American Telephone and Telegraph Company, AT&T Bell Laboratories, Murray Hill, N.J.

[21] Appl. No.: 202,648

[22] Filed: Jun. 6, 1988

[51] Int. Cl.⁴ ............................................. H01J 40/14
[52] U.S. Cl. .................. 250/211 J; 357/23.5
[58] Field of Search ................ 250/211 J, 211 K, 578; 357/2, 4, 19, 30, 24, 23.5, 54

[56] References Cited

U.S. PATENT DOCUMENTS

| | | | |
|---|---|---|---|
| 3,916,390 | 10/1975 | Chang et al. | 357/24 |
| 4,143,393 | 3/1979 | DiMaria et al. | 357/23.5 |
| 4,151,537 | 4/1979 | Goldman et al. | 357/23.5 |
| 4,334,292 | 6/1982 | Kotecha | 357/23.5 |
| 4,354,199 | 10/1982 | Hasegawa et al. | 357/19 |
| 4,454,524 | 6/1984 | Spence | 357/54 |
| 4,476,477 | 10/1984 | Capasso et al. | 357/30 |
| 4,535,349 | 8/1985 | Weinberg | 357/4 |
| 4,544,617 | 10/1985 | Mort et al. | 357/2 |
| 4,737,429 | 4/1988 | Mort et al. | 357/2 |

OTHER PUBLICATIONS

*Optical Bistability: Controlling Light With Light* by H. M. Gibbs, Academic press, (1985), pp. 1–17 and 195–239.
*Applied Physics Letters*, vol. 49, No. 9, Sep. 1, 1986, "Speed and Effectiveness of Windowless GaAs Etalons as Optical Logic Gates", by Y. H. Lee et al., pp. 486–488.
*Proceedings of the IEEE*, vol. 72(7), 1984, "Digital Optical Computing", by A. A. Sawchuck et al., pp. 758–779.
*Proceedings of the IEEE*, vol. 72(7), Jul. 1984, "Architectural Considerations Involved in the Design of an Optical Digital Computer", by A. Huang, pp. 780–786.
*Proceedings of the IEEE Global Telecommunications Conference*, Altlanta, Georgia, 1984, "Starlite: A Wideband Digital Switch", by A. Huang et al., pp. 121–125.

Primary Examiner—David C. Nelms
Assistant Examiner—William L. Oen
Attorney, Agent, or Firm—Eugen E. Pacher

[57] ABSTRACT

Appartaus according to the invention comprises an optical, or opto-electronic device that comprises one or more "trapping" layers that can speed the decay of a non-equilibrium carrier distribution in an active region of the device, thereby improving device characterstics. In preferred embodiments the trapping layers are arranged so as to increase the likelihood of radiative recombination of carriers leading to erased heat sinking requirements.

23 Claims, 3 Drawing Sheets

INTENSITY

OPTICAL OR OPTO-ELECTRONIC DEVICE HAVING A TRAPPING LAYER IN CONTACT WITH A SEMICONDUCTIVE LAYER

FIELD OF THE INVENTION

This invention pertains to the field of optical or opto-electronic devices, and to apparatus comprising such a device.

BACKGROUND OF THE INVENTION

Many optical and/or opto-electronic devices depend for the operation on the presence of a non-equilibrium (with respect to the device temperature) density of electrical carriers (electrons and/or holes) in at least a portion of the device, with the refractive index of the material depending on the density of carriers. Typically the relevant portion of the device consists of semiconductor material, and the non-equilibrium carrier distribution is created by the absorption of electromagnetic radiation (resulting in the creation of electron/hole pairs). However, the non-equilibrium distribution can also be produced by injection of carriers into the portion of the device, e.g., by means of a p-n junction, as will be apparent to those skilled in the art.

However created, the rate at which the non-equilibrium carrier distribution can decay affects the speed at which the device can be operated, e.g., the minimum time between two signal pulses to which the device can respond. It is obviously desirable that the speed of operation be high, and thus it is important to have available means that can affect a speedy decay of a non-equilibrium carrier distribution in a relevant portion of an optical or opto-electronic device. This application discloses such means.

Furthermore, in many semiconductor-based optical and/or opto-electronic devices, an important mechanism for the decay of a non-equilibrium carrier distribution is non-radiative pair recombination. As is well known, this mechanism results in heating of the device, since the energy given up by the electron/hole pair is transferred to the lattice. This frequently poses difficult heatsinking problems, which may, for instance, limit the possible area density of certain devices. e.g., integrated optical switches or logic elements. Thus it would be highly desirable to have available means that can effect a shift away from non-radiative recombination towards radiative recombination, since in the latter at least a portion of the energy given up by a carrier pair is removed from the device in the form of an emitted photon, resulting in eased heat-sinking requirements. This application also discloses such means.

Although the invention can be embodied in a variety of devices, including radiation detectors (an opto-electronic device), much of the discussion below will, for purposes of ease of exposition, be in terms of a particular class of optical devices, namely, nonlinear devices comprising a Fabry-Perot-type etalon. No limitation is thereby implied.

Bistable and other nonlinear optical devices have been known for some time, and a wide variety of signal processing functions can be carried out by means of bistable devices ("bistable" and "nonlinear" are used herein interchangeably unless indicated otherwise by the context). A recent monograph, H. M. Gibbs, *Optical Bistability: Controlling Light With Light*, Academic Press (1985) can serve as an introduction to the field of bistable optical devices. For instance, on pages 1–17, incorporated herein by reference, are given brief discussions of bistable optical logic devices (both two-state and many-state), of an optical transistor, of optical discriminators, limiters, pulse compressors, oscillators, gates, and flip-flops. Pages 195–239, also incorporated herein by reference, contain a detailed discussion of optical switching.

Many of the nonlinear optical devices comprise a nonlinear Fabry-Perot (FP) etalon, a fixed-spacing optical cavity with, typically an optically nonlinear medium within the cavity. Furthermore, much of the work on optically nonlinear devices has focused on devices using solid (typically semiconductor, mostly GaAs-based) nonlinear media. Such media are, for instance, homogeneous GaAs, and GaAs-AlGaAs multiple quantum well (MQW) structures.

In U.S. patent application Ser. No. 870,842, filed June 5, 1986, incorporated herein by reference, is disclosed a monolithic Fabry-Perot etalon with active multilayer mirrors that can be produced by known deposition and patterning techniques without any critical etching step. These etalons can have high finesses, and can be produced in the form of a multi-etalon arrays.

A principal limitation on the operational speed of an optical device that comprises a nonlinear etalon is the recombination time of the hole-electron pairs created in the nonlinear spacer material of the device. As will be readily understood by those skilled in the art, the density of pairs in the relevant portion of the device has to decrease to a relatively small value (from the relatively high value required for the nonlinear action to occur) before another switching action can be initiated.

Surface recombination is a known means for speeding the recovery of GaAs etalons. See, for instance, Y. H. Lee et al., *Applied Physics Letters*, 49,486 (1986). Such recombination typically is nonradiative, releasing essentially all of the energy as heat. Furthermore, due to the relatively long distances involved in the diffusion of hole/electron pairs to the surfaces of typical devics, surface recombination is expected to be limited in the recovery speed-up it can produce. Exemplarily, it may be difficult to obtain recovery times less than about 30 ps with prior art structures.

Due to the promise held by nonlinear FP etalons (as well as by other optical or opto-electronic devices that depend for their functioning on the temporary presence of a non-equilibrium carrier distribution), for instance, in the field of optical data processing (including optical computing), and in optical communications, it would be highly desirable to have available means for speeding up recovery of the device which, optionally, can increase the ratio of radiative to non-radiative recombination, thereby easing heat-sinking requirements.

For information on optical computing, see *Proceedings of the IEEE*, Vol. 72(7) 1984, especially A. A. Sawchuck et al., (pp. 758–779), and H. Huang (pp. 780–786). A. Huang et al., *Proceedings of the IEEE Global Telecommunications Conference*, Atlanta, Ga., 1984, pp. 12114 -125 discloses telecommunications apparatus that can be implemented using nonlinear optical devices.

SUMMARY OF THE INVENTION

In a broad aspect the invention is embodied in apparatus that comprises at least one optical or opto-electronic device comprising a first semiconductor material and at least one "trapping layer" (TL) in contact with the first semiconductor material, means for producing a non-equilibrium, carrier distribution in at least a portion of the semiconductor material (exemplarily a source of electromagnetic radiation or a p-n junction), and means that are responsive to the density of electrons and/or holes in the first semiconductor material. During operation of the apparatus a non-equilibrium density of electrons and/or holes is caused to be present in the first semiconductor material for a part of the time of operation, e.g., by exposure of the device to radiation from the radiation source.

The TL is a layer of a second material chosen such that at least one of the electrons and/or holes has a lower potential energy in the second material than in the first semiconductor material, whereby at least some of the carriers that enter the TL from the first semiconductor material are being trapped in the TL, whereby the density of carriers in the first semiconductor material is decreased. This decrease in the density of electrons and/or holes in the first semiconductor material can exemplarily result in the decrease of the time required by an optical switch or other device to reset, i.e., to be ready for a switching (or appropriate other) event subsequent to a first event. Other inventive devices may exhibit different beneficial characteristics due to the presence of one or more TLs, as will be discussed below in detail. In general, material for use as TL is selected from the III-V semiconductors, the II-VI semiconductors, heavily doped Si and Ge, as well as metals and alloys such as NiAl.

Associated with many of the devices of interest herein is, during at least part of the time of operation of the apparatus, a spatially non-uniform radiation intensity distribution in the device. In particular, one or more regions of relatively low radiation intensity are frequently present in these devices. In some currently preferred embodiments of the invention the TL (or TLs) is (are) located in a region (or regions) of low radiation intensity, whereby deleterious effects of the trapping layer (layers) on the optical properties of the device can be substantially avoided.

In other currently preferred embodiments, the device parameters (e.g., location, thickness, composition of the trapping layer or layers) are chosen such that the probability of radiative recombination of electron/hole pairs in the trapping layer (layers) is substantially increased, whereby the heat sinking requirements for the device can be relaxed. Exemplary means for achieving this end will also be discusssd below.

DETAILED DESCRIPTION OF SOME PREFERRED EMBODIMENTS

In the first portion of this section, is described a particular class of devices according to the invention, namely, nonlinear optical devices that have a FP etalon-like geometry. This is done for the purpose of making the principles of the invention more readily understood, and does not imply any limitation.

Figure 1:
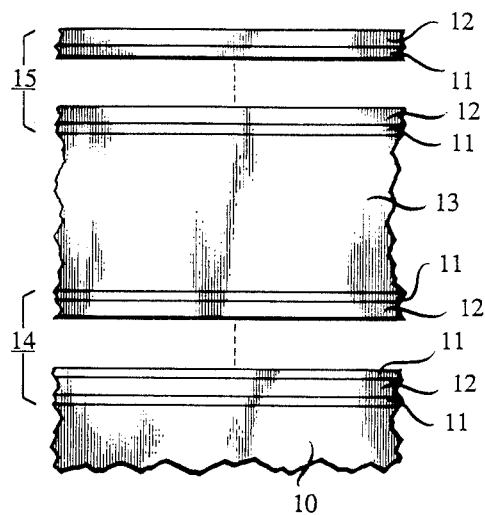
FIG. 1 schematically shows a prior art nonlinear etalon on a substrate.

FIG. 1 schematically depicts a portion of a prior art nonlinear etalon, wherein first reflecting means 14 (consisting of a multiplicity of layers 11 and 12, with 11 and 12 differing in refractive index) are positioned on substrate 10 (e.g., a GaAs wafer), and spacer body 13 (e.g., a GaAs layer of appropriate thickness) is formed of first reflecting means 14, with second reflecting means 15 (exemplarily, but not necessarily, also consisting of interspersed layers 11 and 12) formed on the spacer body. Exemplarily, layers 11 are AlAs, and layers 12 GaAs. The thickness of each type of layers depends, inter alia, on the refractive index of the layer material and on the operating wavelength $\lambda_o$. Typically, the thickness of a layer is chosen to be $\lambda_o/4n$, where n is the refractive index of the layer material at $\lambda_o$. The optical properties of periodically stratified media of the type discussed herein are well known. See, for instance, M. Born and E. Wolf, *Principles of Optics*, 2nd edition (1964), pp. 68-70. Although multilayer dielectric mirrors (including active mirrors) are currently preferred, inventive FP-etalons are no so limited, and all reflective means capable of creating an optical cavity are contemplated.

The spacer body 13 typically is approximately of thickness $\lambda_o/2n$ (or a multiple thereof). It generally, but not necessarily, consists of material that is optically active at $\lambda_o$. The second mirror resembles the first mirror but need not comprise the same combination of materials and/or contain the same number of layers. One or both of the multilayer mirrors may (but need not) comprise optically active material (at $\lambda_o$).

Figure 2:
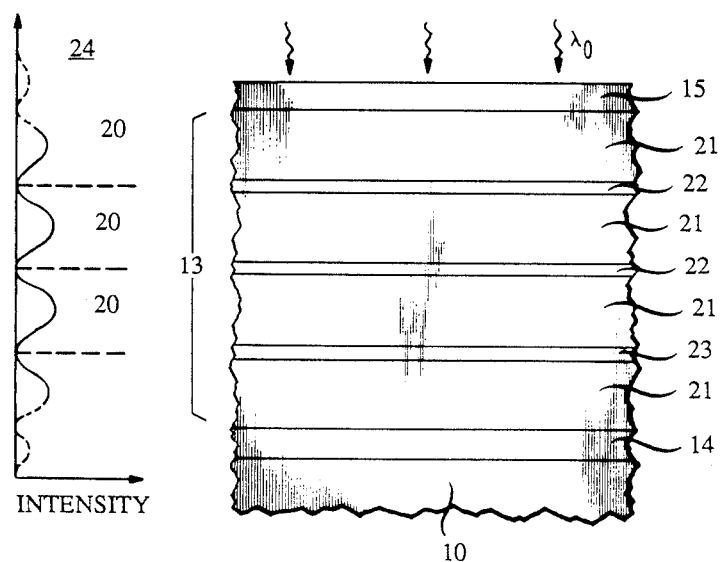
FIG. 2 depicts schematically a portion of an inventive etalon comprising a multiplicity of trapping layers.

FIG. 2 schematically depicts a portion of an exemplary inventive etalon, and furthermore schematically indicates an exemplary field intensity distribution that may exist in the device if radiation of wavelength $\lambda_o$ is coupled into the etalon. In addition to the elements described with reference to FIG. 1, the inventive etalon comprises a multiplicity of TLs 22, exemplarily positioned such that the central plane of any given TL substantially coincides with a nodal plane 20 of the standing wave pattern 24. A "nodal plane" herein is a locus of minimum intensity in a standing wave field. Neighboring TLs are separated by spacer material 21, e.g., GaAs, with an inventive etalon comprising at least one, but typically a multiplicity of, TLs. The thickness of any given TL is substantially less than $\lambda_o/2n$, preferably less than about $\lambda_o/10n$, with the thickness chosen such that the TLs have substantially no effect on the radiation field in the optical cavity (when appropriately placed at nodal planes). The TL material and thickness are chosen such that at least one carrier type is confined in the TL with a confinement energy of at least about kT, where k is the Boltzmann constant and T is the absolute temperature. Exemplarily the active spacer layers 21 are GaAs and the TLs are 15 nm thick layers of $In_{0.25}Ga_{0.75}As$, spaced 123 nm apart.

Figure 3:
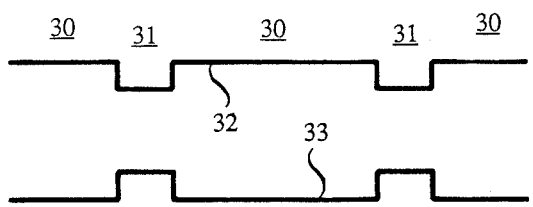
FIGS. 3-5 and 7 schematically depict the bandgap associated with exemplary devices according to the invention.

The bandgap of a structure comprising alternate layers of GaAs and InGaAs is schematically shown in FIG. 3, wherein regions 30 and 31 are associated with GaAs and InGaAs, respectively, and numerals 32 and 33 refer to the conduction band edge and valence band edge, respectively. The bandgap of GaAs is about 1.4 eV, and that of $In_{0.25}Ga_{0.75}As$ is about 1.0 eV. As is well known, at room temperature kT is about 0.025 eV. This condition insures that at least a substantial portion of the carriers that are collected in a TL are confined to the TL for at least the recombination time.

Monolithic inventive etalons of the type shown in FIG. 2 (as well as etalons that can be used in a transmissive mode) can be fabricated by known techniques, typically comprising depositing on a planar major surface of an appropriate substrate the first reflecting means, thereon depositing the spacer body (comprising one or more TLs as well as the layers of the active material), and thereon depositing the second reflecting means, as well as, possibly, other layers. Advantageously, the sequence of depositions is carried out without intermittent handling of the wafer, e.g., in an MBE chamber with multiple sources.

Following completion of the etalon deposition further manufacturing steps may be carried out. Exemplarily, these steps may include deposition of a protective coating onto the top mirror, or coating of the top (and/or bottom) surface of the thus produced combinations with an appropriate resist, such that the top (and/or bottom) surface of the combination can then be patterned by methods well known in the semiconductor industry. By means of such patterning, an array of FP etalons can be produced. Such an aray can easily contain 100×100 etalons, and may contain 1000×1000 or even more etalons.

As will be readily understood by those skilled in the art, the presence of one or more layers of relatively low bandgap material within the spacer body of a FP etalon results in accumulation of carrier pairs in the layer(s). The carriers, which are created by photon excitation during a normal gating operation (primarily in the high bandgap material of the spacer body) diffuse in the material until they encounter a layer of low bandgap material (a TL), or until they recombine at a surface or within the volume of material. If they encounter a TL, there exists a significant probability that the carriers will penetrate into the TL and remain trapped therein. Thus, the TLs acts as carrier sinks that remove carriers from active portions of the device, thereby speeding recovery of the device. It will be understood that inventive devices can use surface recombination in addition to TLs to speed recovery. As soon as a sufficient number of carriers is removed from the high-bandgap portion of the spacer body the device is ready for another gating operation.

It is likely that device cycle times frequently will be much shorter than the recombination time in the TL. In this event carriers will accumulate to much higher densities in the TL than is required in the high bandgap material for device operation (exemplary in the order of $10^{18}/cm^3$). Furthermore, the TLs are thinner than the high bandgap layers, resulting in a further increase in carrier density. This will inherently speed recombination.

For instance, a device may require $10^{18}$ carriers/cm$^3$ over a thickness of about 60 nm to operate and have a 30 ps cycle time. The lifetime in a 10 nm thick TL however might be 500 ps, so accumulated densities on the order of $10^{20}$cm$^{-3}$ (corresponding to $10^{14}$cm$^{-2}$ in the TL "quantum well") would be calculated. The actual lifetime (and, therefore, carrier density) in the TL typically however would be less.

It is known that surface and ordinary volume recombination are largely nonradiative, with essentially all of the energy released as heat. This will frequently present severe heat-sinking problems, especially if many etalons are present on a single substrate.

In preferred embodiments of the invention one or more TLs are positioned, and their parameters chosen, such that these TLs act to enhance radiative recombination, as compared to prior art devices lacking such TLs. That is to say, under identical operating conditions the number of radiative recombination events is larger in a preferred device according to the invention than it is in an otherwise identical device that lacks the means for enhancing radiative recombination.

In an exemplary preferred inventive FP etalon the peak luminescence wavelength $\lambda_e$ of the TLs is substantially the same as the next-longer-wavelength transmission peak of the etalon (as is well known, a FP etalon has a series of narrow transmission peaks spaced apart in wavelength). Importantly, for this longer-wavelength peak at least one of the TLs will be located at or close to an intensity maximum of the standing wave pattern, so stimulated emission will be enhanced. Thus, the etalon can even act as a laser for the luminesence radiation ($\lambda_e > \lambda_o$), and thereby can maximize the amount of energy that is radiated out of the etalon rather than being dissipated as heat. It will be noted that the luminescence radiation typically will not affect operation of the apparatus, since the emitted wavelength differs from the operating wavelength $\lambda_o$. This is considered to be an important advantage of apparatus according to the invention.

Next the invention will be discussed in more general terms.

Figure 4:
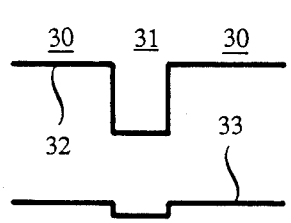
Figure 5:
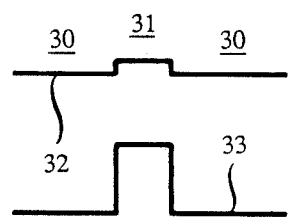

The bandgap relationship illustrated in FIG. 3 is not the only possible one, and FIGS. 4 and 5 illustrate other exemplary relationships. If, as is illustrated in FIG. 4, both the conduction band edge and valence band edge of the TL material are below the respective edges of the contacting spacer material then electrons will be trapped in the usual manner in the TL, with the resulting localized charge imbalance attracting holes into the TL and also trapping them there. FIG. 5 illustrates the obverse situation, which results in trapping of holes in the usual manner, with electrons being bound electrostatically to the TL. It will be appreciated that the quantum "wells" in actual devices need (and frequently are) not as sharply defined as is shown in FIGS. 3–5, and instead may show accidental or intentional grading. Furthermore, it will be appreciated that accumulation of charge in a TL will result in a localized change in the shape of the band edges. This effect is well understood and does not require further discussion.

Although in many cases the TL material will be a semiconductor this is not necessarily so. In particular, it may at times be advantageous to use a metal as the TL material. Exemplarily, the metal is AlNi in combination with GaAs active spacer material. It is known that this combination of materials can be grown epitaxially, and in preferred devices the TL layer is epitaxial with the contacting spacer material.

Whereas it will frequently be desirable to provide a combination of materials that produces relatively deep traps, it may be advantageous to design the device such that the trap or traps are relatively shallow (consistent with the previously stated criterion), especially if efficient energy removal through radiative recombination is considered to be important. As will be appreciated, the difference in carrier energy in the TL material and the active material will appear as thermal energy in the device, and only the bandgap energy of the TL material can be removed radiatively.

As indicated above, TLs are advantageously placed into regions of relatively low radiation intensity. In resonator-type devices such as FP etalons, nodal planes are advantageous low intensity regions, and in devices that have a waveguide-like structure the region at (or close to) the lateral boundary of the device typically is a low intensity region. In devices that have a waveguide-like structure a TL frequently is advantageously placed at the lateral boundary of the device, with one side of the TL contacting the active material. Placement of TLs at the lateral boundary (which typically also is a low intensity region) may also be of advantage in some resonator-type devices, e.g., multiple quantum well (MQW) FP etalons.

Figure 6:
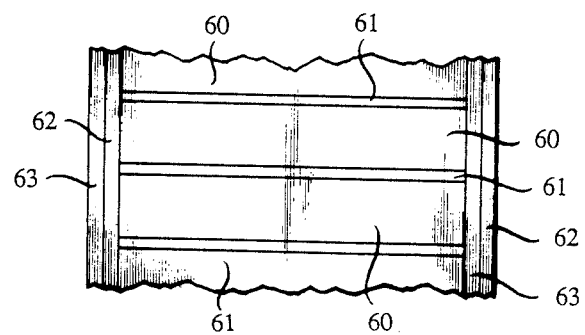
FIG. 6 shows schematically an exemplary multiple quantum well (MQW) device according to the invention.

A portion of such a structure is schematically depicted in FIG. 6. In particular, FIG. 6 shows a portion of a MQW device wherein barrier layers 60 alternate with well layers 61, with the side walls of the device comprising a TL 62 and a further layer 63, with the latter typically having a larger bandgap than the TL and serving to prevent surface recombination of carriers.

Figure 7:
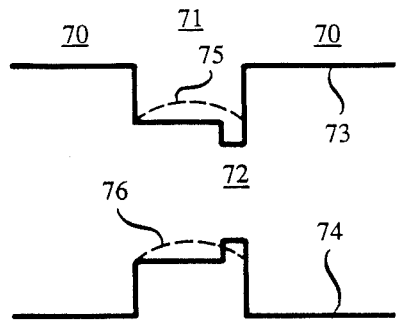

As is exemplified by FIG. 6, TLs can be incorporated into quantum well devices. TLs need not be placed along the lateral boundary of such devices but can be placed parallel to the layers that form the MQW structure, despite the fact that longitudinal charge transport is restricted in such structures. Such transverse TLs are advantageously placed within or close to quantum wells. In the former case the TL (which advantageously is substantially thinner than the quantum well, typically less than 25% of the thickness of the well) may in principle be placed anywhere within the well, but may be advantageously placed at or close to a "wall" of the well, since in this case the presence of the TL will have a relatively small effect on the optical properties of the device. Such an arrangement is schematically illustrated in FIG. 7, wherein numerals 70, 71 and 72 refer to barrier layer, well, and TL, respectively, and 73 and 74 refer to the conduction and the valence band edges, respectively. Dotted lines 75 and 76 indicate an exemplary probability distribution of electrons and holes, respectively, in the well. If the TL is placed outside the quantum well then it is advantageously placed close to the well such that a significant probability exists that carriers can tunnel from the well into the TL.

As stated above, the non-equilibrium carrier distribution in a device according to the invention can be produced by any appropriate method, including carrier injection by means of a p-n junction. For an example of a prior art FP etalon that comprises means for applying a reverse bias voltage to the etalon to affect its optical performance, see U.S. Pat. No. 4,518,934.

A voltage can be applied to an inventive device not only for purpose of carrier injection but also to speed existing carriers toward and into a TL, as will be recognized by those skilled in the art. Thus, means can be provided for setting up an electric field in an inventive device. The field direction may, for instance, be in generally a longitudinal or a transverse direction, and typically will comprise one or more electrodes and/or reverse biased junctions. The movement of carriers towards TLs can also be speeded by appropriate compositional grading of the active material.

In devices according to the invention, TLs may constitute the main means for speeding up the decay of a non-equilibrium carrier distribution, or surface recombination may constitute a further significant mechanism for speeding the decay. On the other hand, means may be provided for suppressing surface recombination (e.g., a surface layer of large bandgap material as depicted in FIG. 6). This may, for instance, be advantageously used with TLs that are designed to enhance radiative recombination.

The GaAs system is not the only material system that can be used to fabricate devices according to the invention, and we consider the inventive principles to be applicable to any appropriate materials system. For instance, inventive devices can be fabricated on a InP substrate, with InGaAsP or InGaAs active material, and InAs TLs. Such devices can be transparent for wavelengths of about 1 μm and larger.

As will be apparent to those skilled in the art, TLs can be viewed broadly as means for tailoring the characteristics of an optical or opto-electronic device. For instance, by incorporating TLs into an optical detector such as PIN photo diode, the detector amplitude can be enhanced if the TLs are parallel to the current flow, and the response speed can be increased if the TLs are perpendicular to the current flow.

Figure 8:
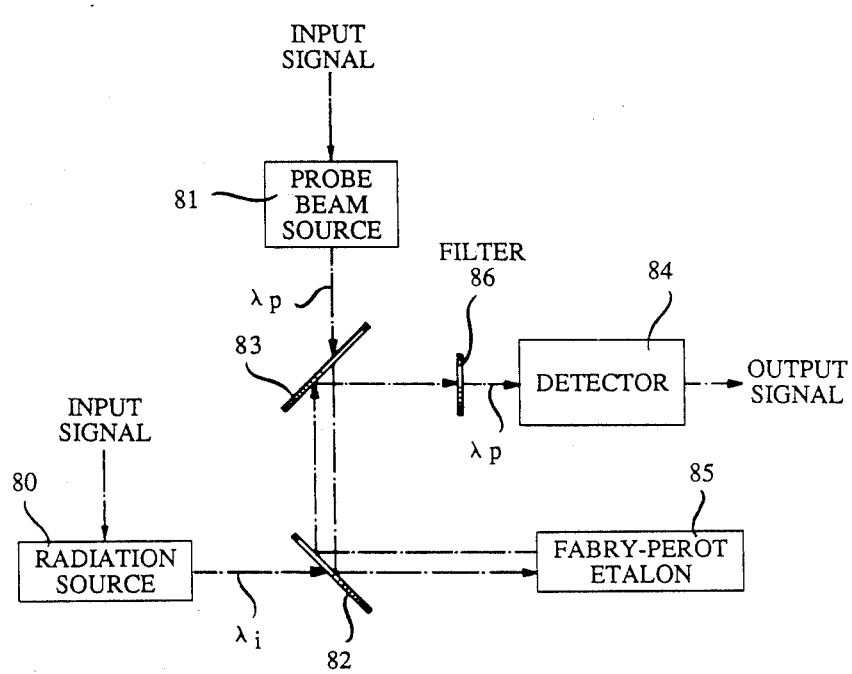
FIG. 8 diagrammatically depicts major elements of exemplary apparatus according to the invention.

FIG. 8 schematically depicts elements of exemplary apparatus according to the invention. The apparatus comprises a source 80 of "input" radiation of wavelength $\lambda_i$, a source 81 of "probe" radiation of wavelength $\lambda_p$, half-silvered mirrors 82 and 83, a FP-etalon according to the invention 85, a filter 86 and a radiation detector 84. Exemplarily $\lambda_p$ and $\lambda_i$ are selected such that the nonlinearity of the etalon is relatively small at $\lambda_p$ and large at $\lambda_i$. Either one of $\lambda_p$ and $\lambda_i$ can be identified with $\lambda_o$. If only probe radiation is directed at the etalon then there is substantially no reflected radiation. If both probe radiation and input radiation are directed at the etalon the optical state of the etalon can change such that a substantial amount of reflected probe radiation is present, and can be detected by means of the detector, resulting in an output indicative of the optical state of the etalon. For instance, if the etalon contains GaAs active material, then $\lambda_i$ and $\lambda_p$ exemplarily are 868 and 873 nm, respectively. If other active materials (e.g., InGaAsP and related compounds) are used then the appropriate wavelengths would be different. If two or more input beams (wavelength $\lambda_i$) can be directed onto the etalon, each of which can cause the described change in the optical state, then the etalon functions as a logical OR gate. Other logic functions can, of course, also be implemented. Finally, apparatus according to the invention typically comprises a multiplicity of individually addressable devices, e.g., etalons comprising TLs.

EXAMPLE 1

By MBE was grown an approximately 1 μm thick body which contained 9 TL layers (about 10 nm thick $In_{0.11}Ga_{0.89}As$) spaced about 125 nm apart, the remainder of the body being GaAs. $Al_{0.4}Ga_{0.6}As$ layers (465 nm thick) were grown on both major faces of the body to prevent surface recombination. The body was then sandwiched between dielectric mirrors to form a Fabry-Perot etalon. The etalon showed about 80% recovery at 300 ps delay after illumination with an 850 nm wavelength input beam. An otherwise identicalk comparison device lacking the TLs showed no sign of recovery at 300 ps delay. It is known that devices similar to the comparison device typically have about 5 ns recovery.

EXAMPLE 2

A multiplicity of etalons is made substantially as described in Example 2 of U.S. patent application Ser. No. 870,842, except that the spacer body contains 9 TLs, substantially as described in Example 1 above. A metal TL optionally can also serve as a mirror in a FP etalon, or electrical contact can be made to the metal FP, e.g., to provide an electric field that can assist in moving carriers from the first semiconductor material into a TL.

What is claimed is:

1. Apparatus comprising
   (a) a source of electromagnetic radiation of wavelength $\lambda_o$;
   (b) at least one optical or opto-electronic device comprising a quantity of a first semiconductor material, during at least part of the time of operation of the apparatus the device is exposed to radiation from the source of radiation, and a non-equilibrium density of electrons and/or holes is caused to be present in the first semiconductor material during at least part of the time of operation of the apparatus; and
   (c) means that are responsive to the density of electrons and/or holes in the first semiconductor material;
   characterized in that
   (d) the device further comprises at least one layer (to be referred to as the "trapping layer") of a second material in contact with the first semiconductor material, the second material chosen such that at least one of the electrons and/or holes has a lower potential energy in the second material than in the first semiconductor material, whereby at least some of the electrons and/or holes that enter the trapping layer from the first semiconductor material are being trapped in the trapping layer such that the non-equilibrium density of electrons and/or holes in the first semiconductor material can be decreased.

2. Apparatus of claim 1, where exposure of the device to the radiation results in a spatially non-uniform intensity of radiation in the device, and the at least one trapping layer is located in a region of relatively low intensity of the radiation.

3. Apparatus of claim 1, wherein the second material is a second semiconductor material, associated with the first and second semiconductor materials being a first and second bandgap energy, respectively, with the second bandgap energy being at least kT less than the first, where k is the Boltzmann constant and T is the absolute temperature of the first semiconductor material.

4. Apparatus of claim 1, wherein the second material is a metal.

5. Apparatus of claim 3, wherein the first semiconductor material is selected from the group consisting of GaAs and InGaAsP, and the second semiconductor material is selected from the group consisting of III-V semiconductors, the II-VI semiconductors, heavily doped Si and heavily doped Ge.

6. Apparatus of claim 1, wherein the quantity of the first semiconductor material comprises a multiple quantum well structure consisting of alternating layers of a relatively high and relatively low bandgap semiconductor material.

7. Apparatus of claim 2, wherein the second material is a second semiconductor material, and wherein associated with the second semiconductor material is a peak luminescence wavelength $\lambda_e > \lambda_o$, and wherein the device parameters are selected such that luminescence of the second semiconductor material results in a relatively high intensity of the radiation of wavelength $\lambda_e$ in at least a part of the device, with the at least one trapping layer being located in the region of relatively high intensity of radiation of wavelength $\lambda_e$, whereby radiative recombination of electrons and holes in the second trapping layer is enhanced and non-radiative recombination is decreased.

8. Apparatus of claim 2, wherein the device is a Fabry-Perot etalon, associated with the etalon being a series of tranmission peaks and a standing wave pattern comprising at least one nodal plane, with the at least one trapping layer being located at or close to the nodal plane and having a thickness substantially less than $\lambda_o/2n$, where n is the refractive index of the first semiconductor material at $\lambda_o$.

9. Apparatus of claim 8 comprising a multiplicity of trapping layers, wherein the standing wave pattern comprises a multiplicity of nodal planes, with each trapping layer located at or close to a nodal plane, wherein the second material is a second semiconductor material, associated with the second semiconductor material is a peak luminescence wavelength $\lambda_e > \lambda_o$, and wherein the device parameters are selected such that $\lambda_o$ at least approximately coincides with a first transmission peak of the etalon and $\lambda_e$ at least approximately coincides with a second transmission peak of the etalon, and such that at least one of the trapping layers is located in a region of relatively high intensity of radiation of wavelength $\lambda_e$, whereby radiative recombination of electrons and holes in the trapping layer is enhanced and non-radiative recombination is decreased.

10. Apparatus of claim 9, wherein the device can lase with the wavelength of the emitted laser radiation being substantially equal to $\lambda_e$.

11. Apparatus of claim 2, wherein associated with the device is a longitudinal direction, and the trapping layer is essentially perpendicular to the longitudinal direction.

12. Apparatus of claim 2, wherein the device has at least one side surface, with the trapping layer being essentially parallel to the side surface and being located at or close to the side surface.

13. Apparatus of claim 12, wherein the side surface is formed by a relatively high bandgap material that is in contact with the trapping layer, whereby non-radiative recombination of electrons and holes in the trapping layer is decreased.

14. Apparatus of claim 6, wherein the trapping layer is located within a layer of the relatively low bandgap semiconductor material (a "well"), and wherein the second material is either a metal or is a semiconductor whose bandgap is lower than the bandgap of the relatively low bandgap semiconductor material that forms the well.

15. Apparatus of claim 6, wherein the trapping layer is located within a layer of the relatively high bandgap semiconductor material and close to a layer of the relatively low bandgap semiconductor material (a "well"), such that electrons and/or holes can tunnel from the well into the barrier layer.

16. Apparatus of claim 1, further comprising means for injecting electrons and/or holes into the first semiconductor material.

17. Apparatus of claim 16, wherein the means for injecting comprise a p-n junction.

18. Apparatus of claim 1, wherein the trapping layer is a metal layer, and further comprising means for making electrical contact with the trapping layer.

19. Apparatus of claim 1, wherein the device is a Fabry-Perot etalon comprising two mirrors and wherein the trapping layer is a metal layer, with the trapping layer being a mirror of the etalon.

20. Apparatus of claim 1, further comprising means for applying an electric field to the device whereby the movement of electrons and/or holes from the first semiconductor material into the trapping layer can be enhanced.

21. Apparatus of claim 1, wherein the first semiconductor material is compositionally graded such that the movement of electrons and/or holes from the first semiconductor material into the trapping layer is enhanced.

22. Apparauts of claim 1, wherein the apparatus is an optical computer, an optical data processing apparatus or an optical communication apparatus.

23. Apparatus of claim 21, comprising a multiplicity of optically isolated Fabry-Perot etalons.

* * * * *